(12) United States Patent
Clark et al.

(10) Patent No.: US 7,692,105 B2
(45) Date of Patent: Apr. 6, 2010

(54) MOUNTING ASSEMBLY FOR A VEHICLE POWER JUNCTION BOX

(75) Inventors: Jeffrey Allen Clark, Macomb Township, MI (US); Philip Anthony Carlisle, Farmington Hills, MI (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 0 days.

(21) Appl. No.: 11/971,245

(22) Filed: Jan. 9, 2008

(65) Prior Publication Data

US 2008/0207017 A1    Aug. 28, 2008

Related U.S. Application Data

(60) Provisional application No. 60/903,157, filed on Feb. 23, 2007.

(51) Int. Cl.
*H01R 13/502*    (2006.01)

(52) U.S. Cl. ..................................... 174/559; 439/76.2
(58) Field of Classification Search ................. 174/559, 174/560, 50, 50.54, 563; 439/76.2, 949
See application file for complete search history.

(56) References Cited

U.S. PATENT DOCUMENTS

| | | | |
|---|---|---|---|
| 6,007,350 A | 12/1999 | Isshiki | |
| 6,547,572 B1 * | 4/2003 | Burdick | 439/76.2 |
| 7,006,681 B2 | 2/2006 | Maeda et al. | |
| 7,032,866 B1 * | 4/2006 | Braun et al. | 248/68.1 |
| 7,075,006 B2 * | 7/2006 | Nojima et al. | 174/58 |
| 7,407,338 B2 * | 8/2008 | Baylis et al. | 403/270 |
| 2009/0034165 A1 * | 2/2009 | Tyler et al. | 361/622 |

* cited by examiner

*Primary Examiner*—Hae Moon Hyeon

(57) ABSTRACT

A mounting assembly for a vehicle power junction box includes a first mounting unit and a second mounting unit having a positioning relative to the first mounting unit. A weld bead is positioned between the first mounting unit and the second mounting unit to vibration weld the first mounting unit relative to the second mounting unit.

18 Claims, 5 Drawing Sheets

MOUNTING ASSEMBLY FOR A VEHICLE POWER JUNCTION BOX

CROSS REFERENCE TO RELATED APPLICATION

This application claims priority to U.S. Provisional Application No. 60/903,157, which was filed on Feb. 23, 2007.

BACKGROUND OF THE INVENTION

This invention generally relates to a vehicle power junction box assembly, and more particularly to a mounting assembly for a vehicle power junction box.

A vehicle generally includes a plurality of electronic equipment mounted therein. For example, a vehicle may include lamps, such as headlight lamps and taillight lamps, motors, such as a starter motor, and numerous other electronic equipment. In addition, the vehicle typically includes a power junction box mounted at a suitable position within the vehicle to supply electrical power to the various electronic equipment mounted therein, facilitate communication and diagnostics between the various electronic equipment, and provide overload protection from the battery via fuses or solid state.

The vehicle power junction box includes a plurality of receptacles including relay receptacles, fuse receptacles and connector receptacles for receiving connectors, relays and fuses. The power junction box may also include busbars and the like for connecting electronic equipment. The power junction box typically includes all the fuses for controlling the electronic components of the vehicle. The junction box is electrically connected to the power sources or loads of the vehicle, such as through electrical wires, for example, to the various vehicle electronic parts in accordance with a predetermined pattern.

A vehicle manufacturer typically utilizes a common power junction box design in each of its vehicle lines. However, because of the different mounting configurations of each separate vehicle line, a unique mounting assembly for each vehicle line may be required. Disadvantageously, different tooling and manufacturing processes are required to produce each unique mounting assembly. That is, a unique set of tooling may be required to manufacture a mounting assembly suitable for any given vehicle line. This may be relatively time consuming, inefficient and expensive.

Accordingly, it is desirable to provide an improved mounting assembly for a vehicle power junction box that is selectively adjustable for use within different vehicle types, cost effective, and inexpensive to manufacture.

SUMMARY OF THE INVENTION

A mounting assembly for a vehicle power junction box includes a first mounting unit and a second mounting unit having a positioning relative to the first mounting unit. A weld bead is positioned between the first mounting unit and the second mounting unit to vibration weld the first mounting unit and the second mounting unit relative to one another.

A power junction box assembly for a vehicle includes a junction box and a mounting assembly. The mounting assembly includes a first mounting unit and a second mounting unit. The first mounting unit and the second mounting unit have a positioning relative to one another that is determined in response to a power junction box mounting arrangement of the vehicle.

A method of mounting a vehicle power junction box assembly includes selecting a desired positioning for a first mounting unit relative to a second mounting unit of the vehicle power junction box assembly, and welding the first mounting unit relative to a second mounting unit.

The various features and advantages of this invention will become apparent to those skilled in the art from the following detailed description. The drawings that accompany the detailed description can be briefly described as follows.

DETAILED DESCRIPTION OF THE DISCLOSED EMBODIMENT

Figure 1:
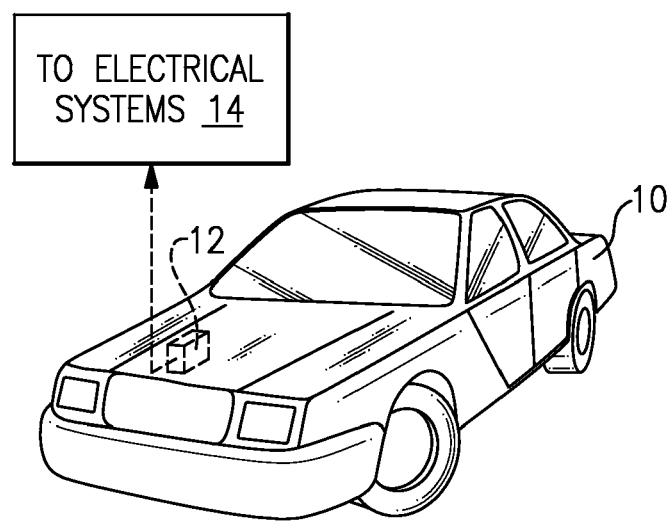
FIG. 1 illustrates a vehicle including an example power junction box assembly.

FIG. 1 illustrates a vehicle 10 having an example power junction box assembly 12. The power junction box assembly 12 houses a plurality of fuses, relays, bus bars, etc., and electrically connects these parts to numerous electrical systems 14 of the vehicle 10. Additionally, the power junction box assembly 12 facilitates communication and diagnostics between the various electronic components of the vehicle 10 and provides overload protection from a vehicle battery via fuses or solid state. For example, the power junction box assembly 12 may distribute power in accordance with a predetermined pattern to the vehicle lights, the HVAC system, the starter motor, etc.

Figure 2:
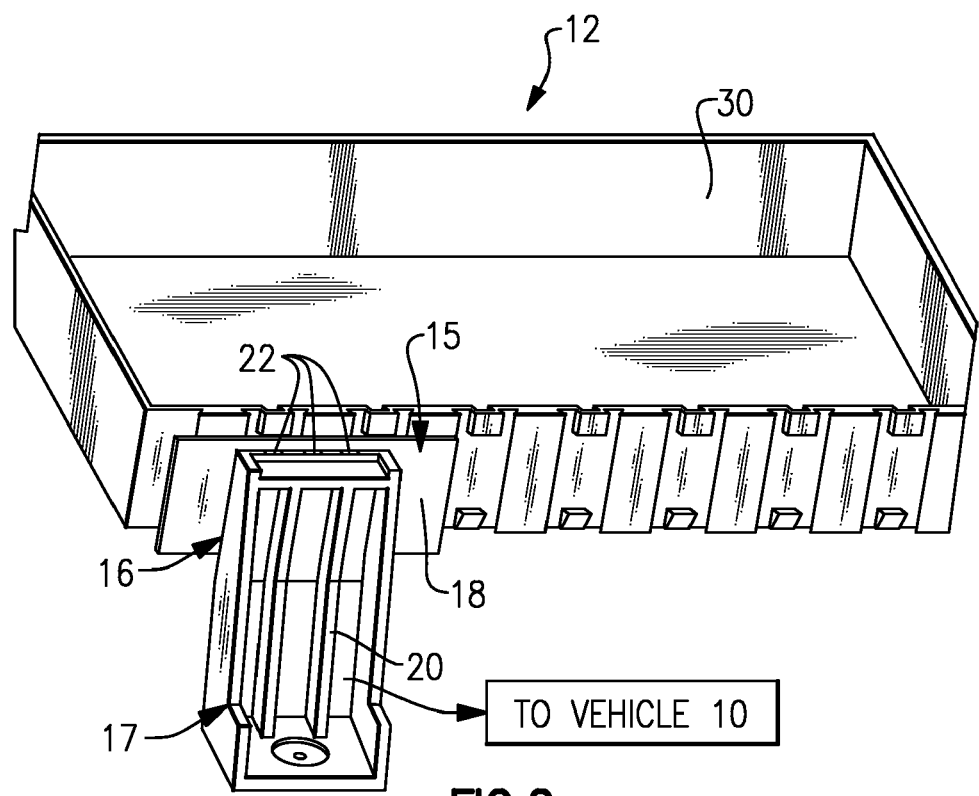
FIG. 2 illustrates an example power junction box assembly including a mounting assembly for a vehicle power junction box.

FIG. 2 illustrates a mounting assembly 16 of the power junction box assembly 12. The mounting assembly 16 includes a first mounting unit 15 and a second mounting unit 17. In one example, the first mounting unit 15 includes a mounting clip 18 and the second mounting unit 17 includes a mounting arm 20. The mounting assembly 16 is utilized to mount a junction box 30 to a portion of the body of the vehicle 10. In one example, the first mounting unit 15 and the second mounting unit 17 are plastic. In another example, the plastic includes polybutylene terephthalate (PBT) having 30% glass fiber by weight. Other materials for constructing the mounting assembly 16 are contemplated as within the scope if this application as would be understood by a person of ordinary skill in the art having the benefit of this disclosure.

In the illustrated example, one side of the mounting clip 18 attaches to the junction box 30 and an opposite side attaches to the mounting arm 20. The mounting arm 20 is attached on an opposite side from the mounting clip 18 to a portion of a body of the vehicle 10 to mount the power junction box assembly 12 to the vehicle 10. Although illustrated herein as including a mounting clip 18 and a mounting arm 20, a person of ordinary skill in the art having the benefit of this disclosure would understand that the mounting assembly 16 could include various other parts and configurations.

The mounting arm 20 includes a plurality of weld beads 22 that protrude from the mounting arm 20. An opposite configuration is possible in which the weld beads 22 are positioned on the mounting clip 18 instead of the mounting arm 20. The weld beads 22 facilitate the attachment of the mounting clip 18 and the mounting arm 20 with any desired orientation relative to one another via a welding technique, as is further discussed below.

Figure 3:
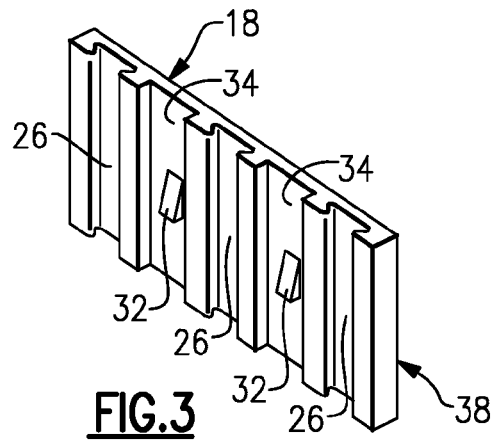
FIG. 3 illustrates an example mounting clip of the mounting assembly illustrated in FIG. 2
Figure 4:
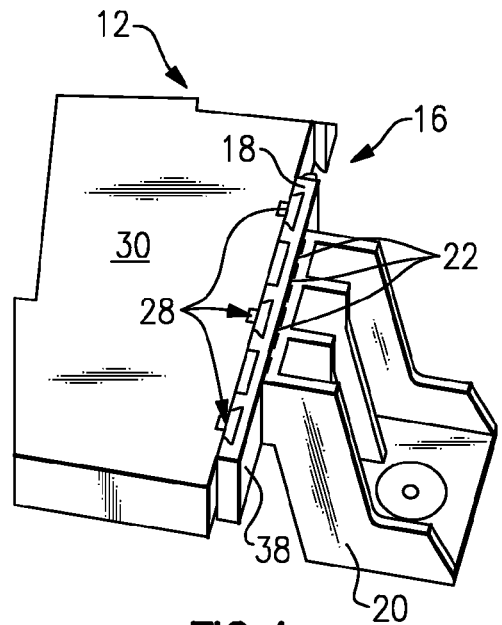
FIG. 4 illustrates example attachment features of the mounting clip illustrated in FIG. 3 for attachment to a power junction box.

Referring to FIGS. 3 and 4, the mounting clip 18 of the mounting assembly 16 includes a plurality of grooves 26 for selectively capturing a plurality of tongue members 28 of the junction box 30 to attach the junction box 30 to the mounting clip 18. In one example, the tongue members 28 are slidably received within the grooves 26. The actual number of grooves 26 and tongue members 28 provided on the mounting clip 18 and the junction box 30 will vary depending upon design specific parameters including, but not limited to, the size and shape of the junction box 30 and the vehicle mounting configuration.

Figure 5:
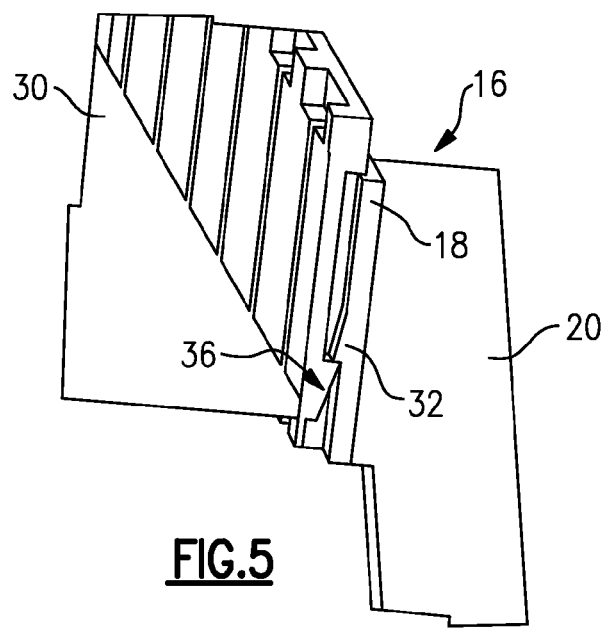
FIG. 5 illustrates a securing snap of the mounting clip illustrated in FIG. 3.

A securing snap 32 is positioned in a recess 34 disposed between each groove 26 of the mounting clip 18. The securing snaps 32 are received against corresponding securing ledges 36 of the junction box 30 to secure the mounting clip 18 to the junction box 30 and to prevent further vertical displacement of the mounting clip 18 relative to the junction box 30 (See FIG. 5). That is, the securing ledges 36 prevent further displacement of the mounting clip 18. It should be understood that the illustrated features of the mounting clip 18 and the junction box 30 are only example attachment features and that numerous other attachments means are within the scope of this application.

Figure 6A:
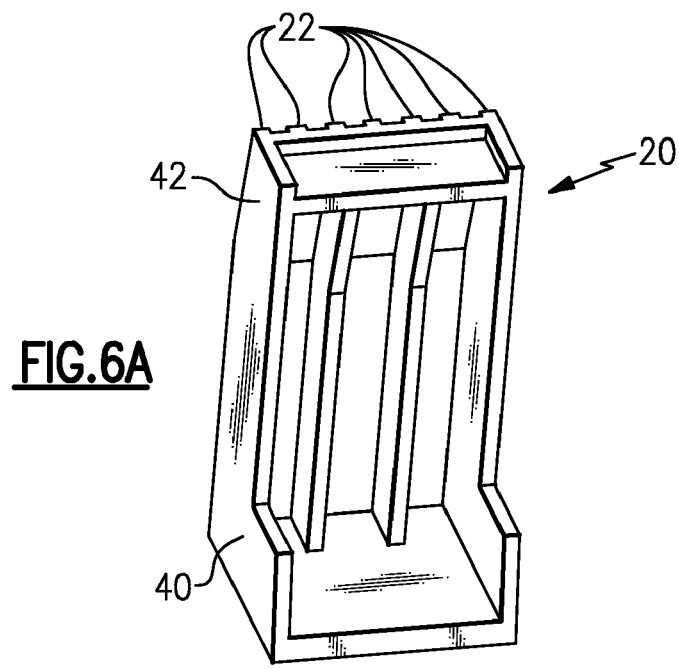
FIGS. 6A and 6B illustrate an example mounting arm of the mounting assembly illustrated in FIG. 2.
Figure 6B:
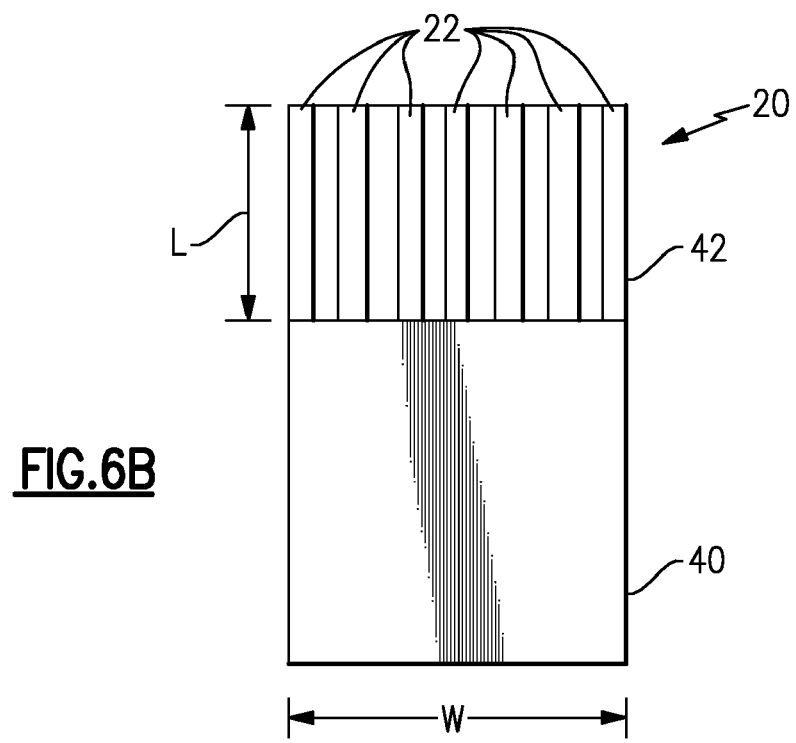

FIGS. 6A and 6B illustrate the mounting arm 20 of the mounting assembly 16. The mounting arm 20 includes a base portion 40 and a mounting portion 42. The mounting portion 42 includes the weld beads 22, in the illustrated example. In one example, the weld beads 22 are integrally molded as a single piece with the mounting arm 20. The mounting portion 42 mounts to the mounting clip 18 via the weld beads 22, as is further discussed below. The base portion 40 of the mounting arm 20 mounts to a portion of the body of the vehicle 10. In one example, the base portion 40 includes a clip for attachment to the vehicle 10. In another example, the mounting arm 20 attaches to the vehicle 10 via a mounting hole. A person of ordinary skill in the art having the benefit of this disclosure would be able to attach the mounting arm 20 to the vehicle 10.

The weld beads 22 extend longitudinally along a length L of the mounting portion 42, in one example. In another example, the weld beads 22 extend horizontally along a width W of the mounting portion 42. It should be understood that the positioning and configuration of the weld beads 22 will vary depending upon design specific parameters including, but not limited to, the mounting configuration of the vehicle that the power junction box assembly 12 is to be mounted to.

Figure 7:
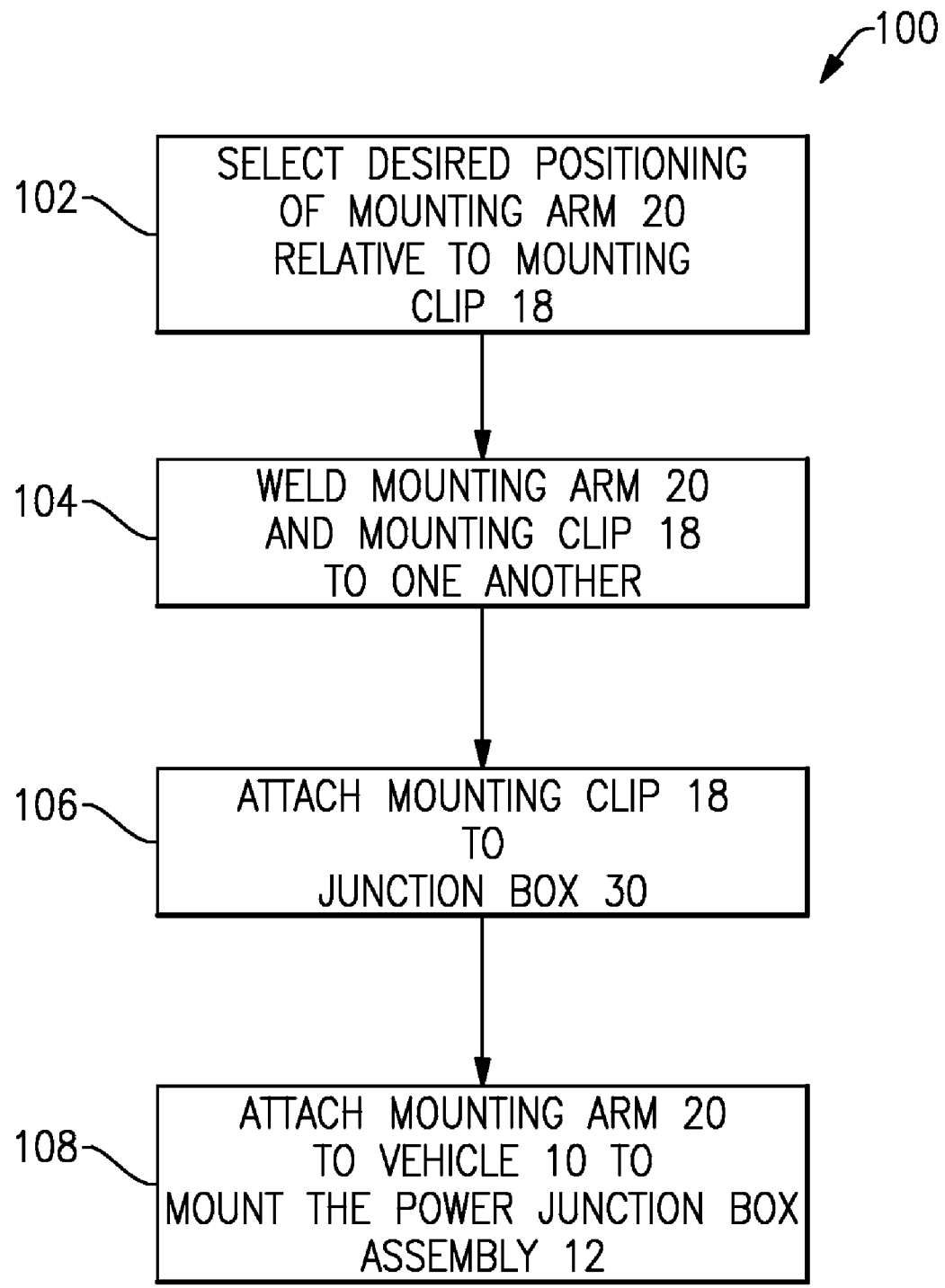
FIG. 7 illustrates a method of mounting a vehicle power junction box assembly within a vehicle.

FIG. 7, with continued reference to FIGS. 1-6, illustrates an example method 100 for mounting the power junction box assembly 12 within the vehicle 10. At step block 102, a desired positioning of the mounting arm 20 relative to the mounting clip 18 is selected. In one example, the positioning of the mounting arm 20 relative to the mounting clip 18 is selected based upon a mounting arrangement of a specific vehicle 10. That is, depending upon the space, design and mounting configuration of the vehicle 10 that the power junction box assembly 12 is to be mounted to, the mounting assembly 16 is universally configurable to accommodate any vehicle design.

Figure 8A:
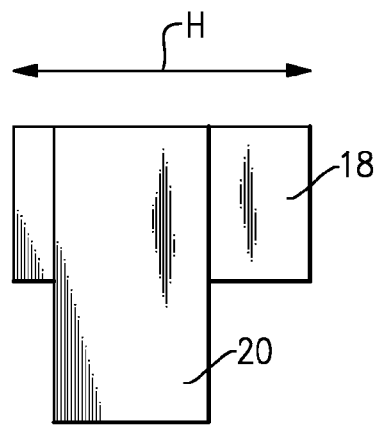
FIGS. 8A-8C each illustrate an example positioning of the mounting arm relative to the mounting clip of the mounting assembly illustrated in FIG. 2.
Figure 8B:
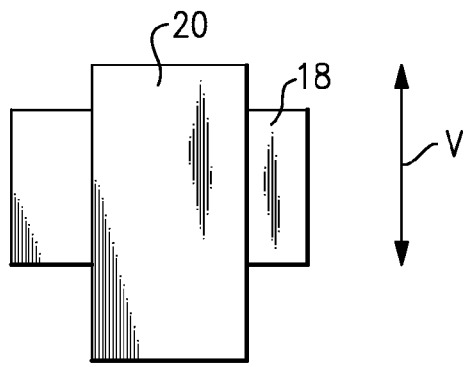
Figure 8C:
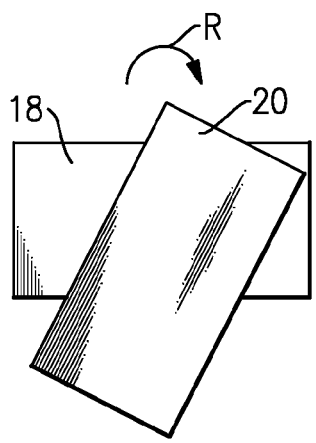

In one example, the mounting arm 20 is positionable relative to the mounting clip 18 at any horizontal position H along the mounting clip 18 (See FIG. 8A). In another example, the mounting arm 20 is positionable relative to the mounting clip 18 at any vertical position V of the mounting clip 18 (See FIG. 8B). In yet another example, the mounting arm 20 is positionable relative to the mounting clip 18 at any rotational angle R relative to the mounting clip 18 (See FIG. 8C). Although the present examples are illustrated in terms of mounting the mounting arm 20 relative to the mounting clip 18, it should be understood that an opposite configuration in which the positioning of the mounting clip 18 relative to the mounting arm 20 is varied is contemplated as within the scope of the present application. Further, any combination of horizontal, vertical and rotational positioning of the mounting arm 20 relative to the mounting clip 18 is achievable by the mounting assembly 16.

Next, at step block 104, the mounting clip 18 and the mounting arm 20 are welded to one another. In one example, the welding process includes a linear vibration welding technique. For example, each of the mounting clip 18 and the mounting arm 20 are held in a fixture such that the weld beads 22 contact a rub surface 38 of the mounting clip 18 (See FIG. 4). The fixture holding the mounting arm 20 is then moved relative to the fixture holding the mounting clip 18. A friction force is created between the weld beads 22 and the rub surface 38 when the fixture is moved at a relatively high velocity. The friction force causes the weld beads 22 to melt thereby fusing the mounting arm 20 and the mounting clip 18 together to assemble the mounting assembly 16.

The mounting clip 18 is attached to the junction box 30 at step block 106. Finally, the mounting arm 20 is attached to a portion of the body of the vehicle 10 to mount the power junction box assembly 12 to the vehicle 10 at step block 108.

The example power junction box assembly 12 illustrated herein provides a unique mounting assembly 16 for mounting a power junction box 30 to a vehicle 10. The components of the mounting assembly 16 are of reduced complexity compared to prior art mounting assemblies. In addition, because of the flexible orientation and positioning provided by the mounting arm 20 and the mounting clip 18, a reduced amount of time is necessary to tool and manufacture the mounting assembly 16 for vehicles have different mounting arrangements.

The foregoing description shall be interpreted as illustrative and not in any limiting sense. A worker of ordinary skill in the art would recognize that certain modifications would come within the scope of this invention. For that reason, the following claims should be studied to determine the true scope and content of this invention.

What is claimed is:

1. A mounting assembly for a vehicle power junction box, comprising:
   a first mounting unit;
   a second mounting unit having a positioning relative to the first mounting unit; and
   at least one weld bead positioned between said first mounting unit and said second mounting unit to vibration weld said first mounting unit at said positioning relative to said second mounting unit.

2. The assembly as recited in claim 1, wherein said positioning is determined based upon a vehicle mounting arrangement.

3. The assembly as recited in claim 1, wherein said first mounting unit includes a mounting clip and said second mounting unit includes a mounting arm.

4. The assembly as recited in claim 3, wherein said mounting clip includes a plurality of grooves and a plurality of recesses disposed between each of said plurality of grooves, and said plurality of recesses each include a securing snap.

5. The assembly as recited in claim 3, wherein said mounting arm includes a base portion and a mounting portion, and said weld beads are integrally formed on said mounting portion.

6. The assembly as recited in claim 1, wherein said at least one weld bead is formed integrally with one of said first mounting unit and said second mounting unit.

7. A power junction box assembly for a vehicle, comprising:
   a junction box;
   a mounting assembly mounted to said junction box and including a first mounting unit and a second mounting unit; and
   wherein said first mounting unit and said second mounting unit include a positioning relative to one another, and said positioning is determined in response to a mounting arrangement of said vehicle to mount said junction box to said vehicle, and wherein said positioning is adjustable in each of a horizontal direction, a vertical direction and a rotational direction relative to one of said first mounting unit and said second mounting unit.

8. The assembly as recited in claim 7, wherein said first mounting unit includes a mounting clip and said second mounting unit includes a mounting arm.

9. The assembly as recited in claim 7, comprising at least one weld bead positioned between said first mounting unit and said second mounting unit to vibration weld said first mounting unit at said positioning relative to said second mounting unit.

10. A method of mounting a vehicle power junction box assembly, comprising the steps of:
   a) selecting a desired positioning of a first mounting unit of the vehicle power junction box assembly relative to a second mounting unit of the vehicle power junction box assembly; and
   b) providing one of the first mounting unit and the second mounting unit with at least one weld bead; and rubbing the at least one weld bead against a surface of the other of the first mounting unit and the second mounting unit to attach the first mounting unit to the second mounting unit.

11. The method as recited in claim 10, comprising the steps of:
   c) attaching the first mounting unit to a junction box of the vehicle power junction box assembly; and
   d) attaching the second mounting unit to a portion of a vehicle body.

12. The method as recited in claim 10, wherein said step b) includes the step of:
   linear vibration welding the first mounting unit relative to the second mounting unit.

13. The method as recited in claim 10, wherein the at least one weld bead includes a plurality of weld beads.

14. The method as recited in claim 10, wherein a mounting portion of the second mounting unit is positioned and secured relative to the first mounting unit.

15. The method as recited in claim 10, wherein said step a) is performed prior to said step b).

16. The method as recited in claim 10, wherein said step a) includes the step of:
   selecting the positioning of the first mounting unit relative to the second mounting unit based on a mounting arrangement of a vehicle.

17. The method as recited in claim 10, wherein said step a) includes the step of:
   selecting a horizontal positioning, a vertical positioning and an angular positioning of one of the first mounting unit and the second mounting unit relative to the other of the first mounting unit and the second mounting unit.

18. A mounting assembly for a vehicle power junction box, comprising:
   a first mounting unit;
   a second mounting unit having a positioning relative to the first mounting unit; and
   at least one weld bead positioned between said first mounting unit and said second mounting unit to vibration weld said first mounting unit at said positioning relative to said second mounting unit; wherein said positioning is adjustable in each of a horizontal direction, a
   vertical direction and a rotational direction relative to one of said first mounting unit and said second mounting unit.

* * * * *